(12) United States Patent
Mann et al.

(10) Patent No.: US 11,608,568 B1
(45) Date of Patent: Mar. 21, 2023

(54) SINGLE CRYSTALLINE RBUO$_3$ AND METHOD OF MAKING AND USING SAME

(71) Applicant: Government of the United States, as represented by the Secretary of the Air Force, Wright-Patterson AFB, OH (US)

(72) Inventors: James M. Mann, Springboro, OH (US); Thomas A. Bowen, Aix en Provence (FR); Eric M. Hunt, Glen Rock, PA (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/880,915

(22) Filed: Aug. 4, 2022

Related U.S. Application Data (62) Division of application No. 16/890,084, filed on Jun. 2, 2020.

(60) Provisional application No. 62/863,974, filed on Jun. 20, 2019.

(51) Int. Cl.
| | |
|---|---|
| C30B 29/00 | (2006.01) |
| C30B 29/22 | (2006.01) |
| C01F 17/32 | (2020.01) |
| C30B 7/10 | (2006.01) |
| C01G 43/01 | (2006.01) |

(52) U.S. Cl.
CPC .............. *C30B 29/22* (2013.01); *C01F 17/32* (2020.01); *C30B 7/10* (2013.01); *C01G 43/01* (2013.01)

(58) Field of Classification Search
CPC ........... C30B 29/22; C30B 7/10; C01D 17/00; C01D 17/003; C01G 43/01
See application file for complete search history.

(56) References Cited

U.S. PATENT DOCUMENTS

| | | |
|---|---|---|
| 9,670,958 B2 | 6/2017 | Mann et al. |
| 9,903,041 B2 | 2/2018 | Mann et al. |
| 9,909,229 B2 | 3/2018 | Mann et al. |
| 11,346,017 B1 * | 5/2022 | Mann ................. C01G 43/00 |
| 2018/0171505 A1 | 6/2018 | Mann et al. |
| 2022/0209020 A1 | 6/2022 | Mann et al. |

OTHER PUBLICATIONS

Mann et al. Unpublished U.S. Appl. No. 16/238,599.
Bera, S; Sali, S.K.; Sampath, S.; Narasimhan, S.V.; Venugopal, V.; Oxidation state of uranium: an XPS study of alkali and alkaline earth uranates, Journal of Nuclear Materials 1998, 255(1), 26-33.
Bickel, M.; Kanellakopulos, B; Systematics in the magnetic properties of ternary actinoid oxides, Journal of Solid State Chemistry (1993), 107(1), 273-284.
Chawla, K.L.; Misra, N.L.; Jayadevan, N.C.; Uranium oxide (M2U4012) compounds of potassium, rubidium and thallium, Journal of Nuclear Materials (1988), 154(2-3), 181-5.
Sali, S.K.; Kulkarni, N.K.; Sampath, S.; Jayadevan, N.C.; Solid state reactions of uranium oxide and alkali metal chromates: characterization of new uranates, Journal of Nuclear Materials (1994), 217(3), 294-9.
Soldatovb, A.V.; Lamoena, D.; Konstantinovic, M.J.; Van Den Berghec, S.; Scheinostd, A.C.; Verwerftc, M.; Local structure and oxidation state of uranium in some ternary oxides: X-ray absorption analysis, Journal of Solid State Chemistry (2007), 180(1), 54-61.
Von Kemmler-Sack, S.; Rudoroff, W.; Ternary oxides VII. Ternary uranium(V) oxides with mono- and divalent cations, Zeitschrift fuer Anorganische und Allgemeine Chemie (1967), 354(5-6), 255-72.
Von Kemmler-Sack, S.; Spectroscopic behavior of the uranium (V) ion in ternary oxide, Zeitschrift fuer Anorganische und Allgemeine Chemie (1968), 363(5-6), 295-304.
Von Kemmler-Sack, S.; Stumpp, E.; Rudorff, W.; H. Erfurth, H.; Ternary oxides. IX. Magnetism of the uranium(V) ion in ternary oxides, Zeitschrift fuer Anorganische und Allgemeine Chemie (1967), 354(5-6), 287-300.

* cited by examiner

*Primary Examiner* — Steven J Bos
(74) *Attorney, Agent, or Firm* — AFMCLO/JAZ; James F. McBride (57) ABSTRACT

The present invention relates to single crystalline RbUO$_3$, hydrothermal growth processes of making such single crystals and methods of using such single crystals. In particular, Applicants disclose single crystalline RbUO$_3$ single crystalline RbUO$_3$ in the Pm-3m space group. Unlike other powdered RbUO$_3$, Applicants' single crystalline RbUO$_3$ has a sufficient crystal size to be characterized and used in the fields of neutron detection, radiation-hardened electronics, nuclear forensics, nuclear engineering photovoltaics, lasers, light-emitting diodes, photoelectrolysis and magnetic applications.

11 Claims, 7 Drawing Sheets

SINGLE CRYSTALLINE RBUO₃ AND METHOD OF MAKING AND USING SAME

CROSS-REFERENCE TO RELATED APPLICATION

The present application is divisional of U.S. patent Ser. No. 16/890,084 filed Jun. 2, 2020, which in turn claims priority to U.S. Provisional Application Ser. No. 62/863,974 filed Jun. 20, 2019, the contents of both such priority applications hereby being incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to single crystalline $RbUO_3$, hydrothermal growth processes of making such single crystals and methods of using such single crystals.

BACKGROUND OF THE INVENTION

Currently $RbUO_3$ can only be produced in powdered form. Unfortunately, the powdered forms of $RbUO_3$ do not contain single crystalline $RbUO_3$ having a sufficient crystal size for applications in the desired fields of neutron detection, radiation-hardened electronics, nuclear forensics, nuclear engineering photovoltaics, lasers, light-emitting diodes, photoelectrolysis and magnetic applications. In fact, powdered forms of $RbUO_3$ are made of particles that are even too small to perform some optical, magnetic, electrical, and physical property characterizations of such material. Thus any applications that require bulk or even thin film single crystals $RbUO_3$ cannot be realized with current forms of $RbUO_3$.

Applicants recognized that the problem that impeded obtaining suitably sized single crystalline $RbUO_3$ was the water temperature of the state of the art growth processes. As a result, Applicants developed a process of growing $RbUO_3$ crystals above the critical temperature for water. By surpassing the critical point of water, Applicants were are able to increase the solubility of the feedstock to elicit larger spontaneous nucleation and provide conditions for bulk crystal growth via transport growth reactions. In addition to the aforementioned water temperature, Applicants utilized sealed silver and platinum growth ampules to avoid impurities caused by the walls of the autoclave or from the ampules themselves.

As a result of the aforementioned process innovation, Applicants disclose single crystalline $RbUO_3$ that can be characterized and that have a sufficient crystal size for use in the fields of neutron detection, radiation-hardened electronics, nuclear forensics, nuclear engineering photovoltaics, lasers, light-emitting diodes, photoelectrolysis and magnetic applications.

SUMMARY OF THE INVENTION

The present invention relates to single crystalline $RbUO_3$, hydrothermal growth processes of making such single crystals and methods of using such single crystals. In particular, Applicants disclose single crystalline $RbUO_3$ single crystalline $RbUO_3$ in the Pm-3m space group. Unlike other powdered $RbUO_3$, Applicants' single crystalline $RbUO_3$ has a sufficient crystal size to be characterized and used in the fields of neutron detection, radiation-hardened electronics, nuclear forensics, nuclear engineering photovoltaics, lasers, light-emitting diodes, photoelectrolysis and magnetic applications.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Unless specifically stated otherwise, as used herein, the terms "a", "an" and "the" mean "at least one".

As used herein, the terms "include", "includes" and "including" are meant to be non-limiting.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

Unless otherwise noted, the written notation of the unit cell and atomic coordinates is designed via a number and an optional second number next to the first number in parenthesis, for example, a cell length a of 4.3320(5). This is understood by those in the art to have a value of 4.3320 plus or minus 0.0005.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

DETAILED DESCRIPTION OF THE INVENTION

Single Crystalline $RbUO_3$

Applicants disclose a single crystalline $RbUO_3$, said crystal having a crystal size of at least 3.5 mm×3.5 mm×2 mm, alternatively, said crystal may have a crystal size of 3.5 mm×3.5 mm×2 mm to about 305 mm×305 mm×305 mm, or said crystal may have a crystal size of 3.5 mm×3.5 mm×2 mm to about 152 mm×152 mm×152 mm. Alternatively, the crystal size may be expressed as a crystal volume, said crystal volume being at least 24.5 cubic millimeters, alternatively said crystal volume being from 24.5 cubic millimeters to 28,372,625 cubic millimeters or alternatively said crystal volume being from 24.5 cubic millimeters to 3,511,808 cubic millimeters.

Applicants disclose a single crystalline $RbUO_3$ according to Paragraph 0023 having a Pm-3m space group.

Applicants disclose a single crystalline $RbUO_3$ according to Paragraphs 0023 to 0024 having the following coordinates: a cell length a of 4.3320(5); a cell length b of 4.3320(5); a cell length c of 4.3320(5); a cell angle alpha of 90.00; a cell mangle beta of 90.00; and a cell angle gamma of 90.00.

Applicants disclose a single crystalline $RbUO_3$ according to Paragraphs 0023 to 0024 having the following coordinates: a Rb1 having x=0.5000, y=0.5000 and z=−0.5000; a U1 having x=0.0000, y=0.0000 and z=−0.0000; and a O1 having x=0.5000, y=0.0000 and z=0.0000.

Process of Making Single Crystalline $RbUO_3$

Applicants disclose a process making a single crystalline $RbUO_3$ having a Pm-3m symmetry structure, said process comprising autoclaving for a period of from about 24 hours to about one year, preferably from about 14 days to about 180 days, more preferably from about 90 days to about 120 days, at a pressure of from about 200 psi to about 100,000 psi, preferably from about 10,000 psi to about 40,000 psi, more preferably from about 20,000 psi to about 25,000 psi, a container comprising an ampoule comprising one or more powdered feedstocks and one or more mineralizers, said ampoule having a bottom feedstock zone and a top crystal growth zone, said bottom feedstock zone having a temperature range of from about 200° C. to 1000° C., preferably from about 300° C. to about 800° C., more preferably from about 600° C. to 700° C. and top crystal growth zone having a temperature range of from about 50° C. to 950° C., preferably from about 200° C. to about 700° C., more preferably from about 550° C. to 650° C., said process having a temperature gradient between said bottom feedstock zone and said top crystal growth zone of from about 1° C. to 130° C., preferably from about 25° C. to about 80° C., more preferably from about 40° C. to 60° C. and most preferably about 50° C.; said container having an internal fill to ampoule volume ratio of 0.001-4.999:5, a feed stock to mineralizer ratio of 0.01-8:4, and when more than one powdered feedstock is employed a feedstock ratio of from 0.01:4 to 4:0.01 for said feedstocks; preferably an internal fill to ampoule volume ratio of 2-4.5:5, a feed stock to mineralizer ratio of 0.5-3:4, when more than one powdered feedstock is employed a feedstock ratio of from 1:4 to 4:1 for said feedstocks, more preferably an internal fill to ampoule volume ratio of 4:5, a feed stock to mineralizer ratio of 1:4, when more than one powdered feedstock is employed a feedstock ratio of from 1:1 or said feedstocks. The aforementioned crystal, by way of example, may have a crystal size of at least 3.5 mm×3.5 mm×2 mm, alternatively, said crystal may have a crystal size of 3.5 mm×3.5 mm×2 mm to about 305 mm×305 mm×305 mm, or said crystal may have a crystal size of 3.5 mm×3.5 mm×2 mm to about 152 mm×152 mm×152 mm. Alternatively, the crystal size may be expressed as a crystal volume, said crystal volume being at least 24.5 cubic millimeters, alternatively said crystal volume being from 24.5 cubic millimeters to 28,372,625 cubic millimeters or alternatively said crystal volume being from 24.5 cubic millimeters to 3,511,808 cubic millimeters.

Applicants disclose the process of Paragraph 0027 wherein said crystal growth zone of said container comprises a seed crystal, preferably said seed crystal has a Pm-3m space group.

Applicants disclose the process of Paragraph 0028 wherein said seed crystal has: a cell length a of 4.3320(5); a cell length b of 4.3320(5); a cell length c of 4.3320(5); a cell angle alpha of 90.00; a cell mangle beta of 90.00; and a cell angle gamma of 90.00.

Applicants disclose the process of Paragraph 0029 wherein said seed crystal has: a Rb1 having x=0.5000, y=0.5000 and z=−0.5000; a U1 having x=0.0000, y=0.0000 and z=−0.0000; and a O1 having x=0.5000, y=0.0000 and z=0.0000.

Applicants disclose the process of Paragraph 0027 wherein said crystal growth zone of said container comprises a non-native seed crystal, preferably said seed crystal has a perovskite structure, more preferably said seed crystal comprises $SrTiO_3$ and/or $KUO_3$.

Figure 1:
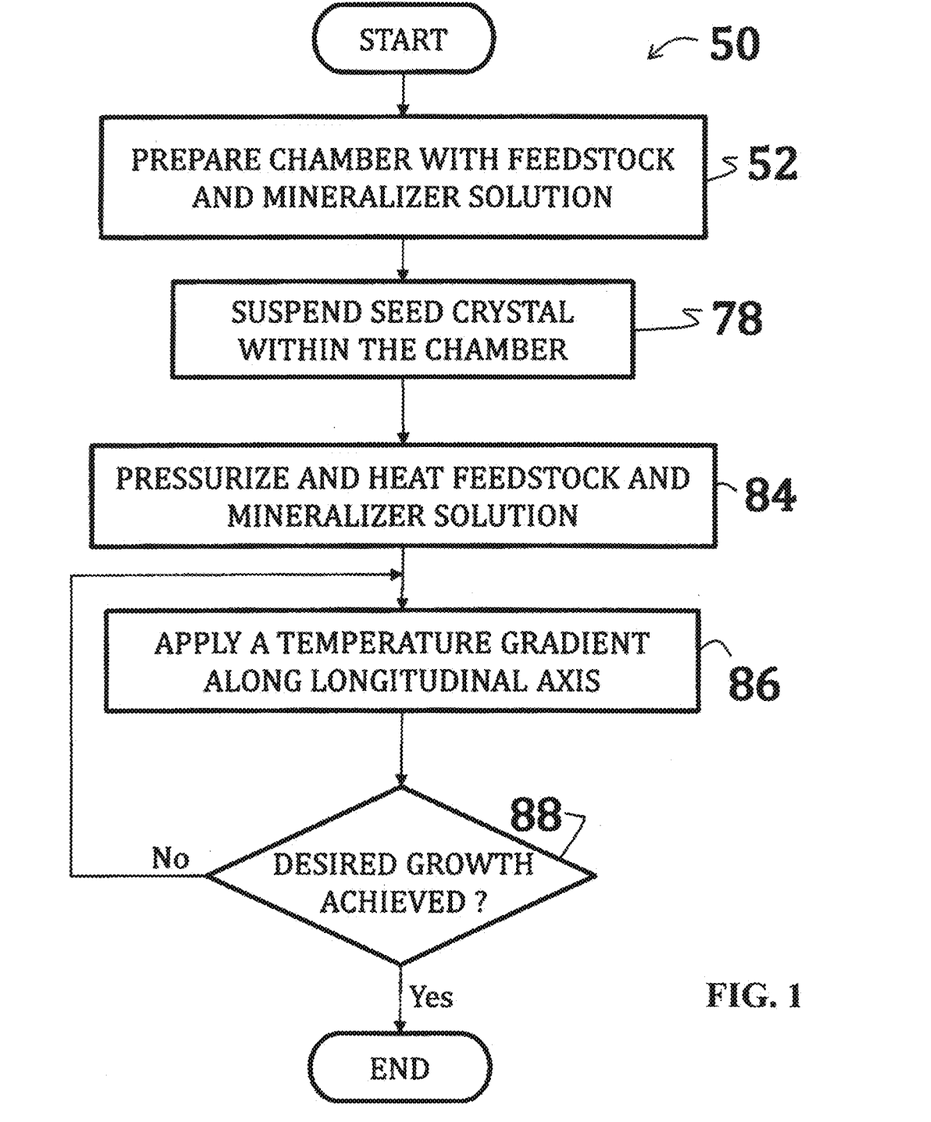
FIG. 1 is a flowchart illustrating a method of synthesizing uranium-based crystals in accordance with an embodiment of the present invention.

Referring now to the figures, and in particular to FIG. 1, a flowchart illustrating a method 50 of synthesizing single crystals according to an embodiment of the present invention is described. In Block 52, a chamber 54 within a pressurizable reaction device 56 (FIG. 2) is prepared with a feedstock and a mineralizer solution (collectively illustrated as solution 57 in FIG. 2A).

Composition of the feedstock and the mineralizer solution depend, in part, of the desired crystal yielded. The feedstock may be powdered or polycrystalline and provide nutrient for crystal growth. For $RbUO_3$ crystals, triuranium octoxide ($U_3O_8$), rubidium uranium oxided ($RbUO_3$), uranium dioxide ($UO_2$) or uranium trioxide ($UO_3$) may be used. The mineralizer solution, generally used for dissolution of nutrient, formation of spuriously nucleated single crystals, or both, may be generally comprised of an rubidium hydroxide, rubidium halides, rubidium carbonate, and mixtures thereof. Mineralizer solutions have concentrations ranging from about 0.1 M to about 30 M.

TABLE 1

| CRYSTAL | SEED CRYSTAL (if any) | FEED-STOCK | MINERALIZER SOLUTION |
|---|---|---|---|
| RbUO$_3$ | RbUO$_3$, Non-native seeds including SrTiO3, KUO3, and other perovskite structures. | RbUO$_3$, U$_3$O$_8$ UO$_2$ UO$_3$ | Rubidium hydroxide Rubidium halides Rubidium carbonate |

Figure 2A:
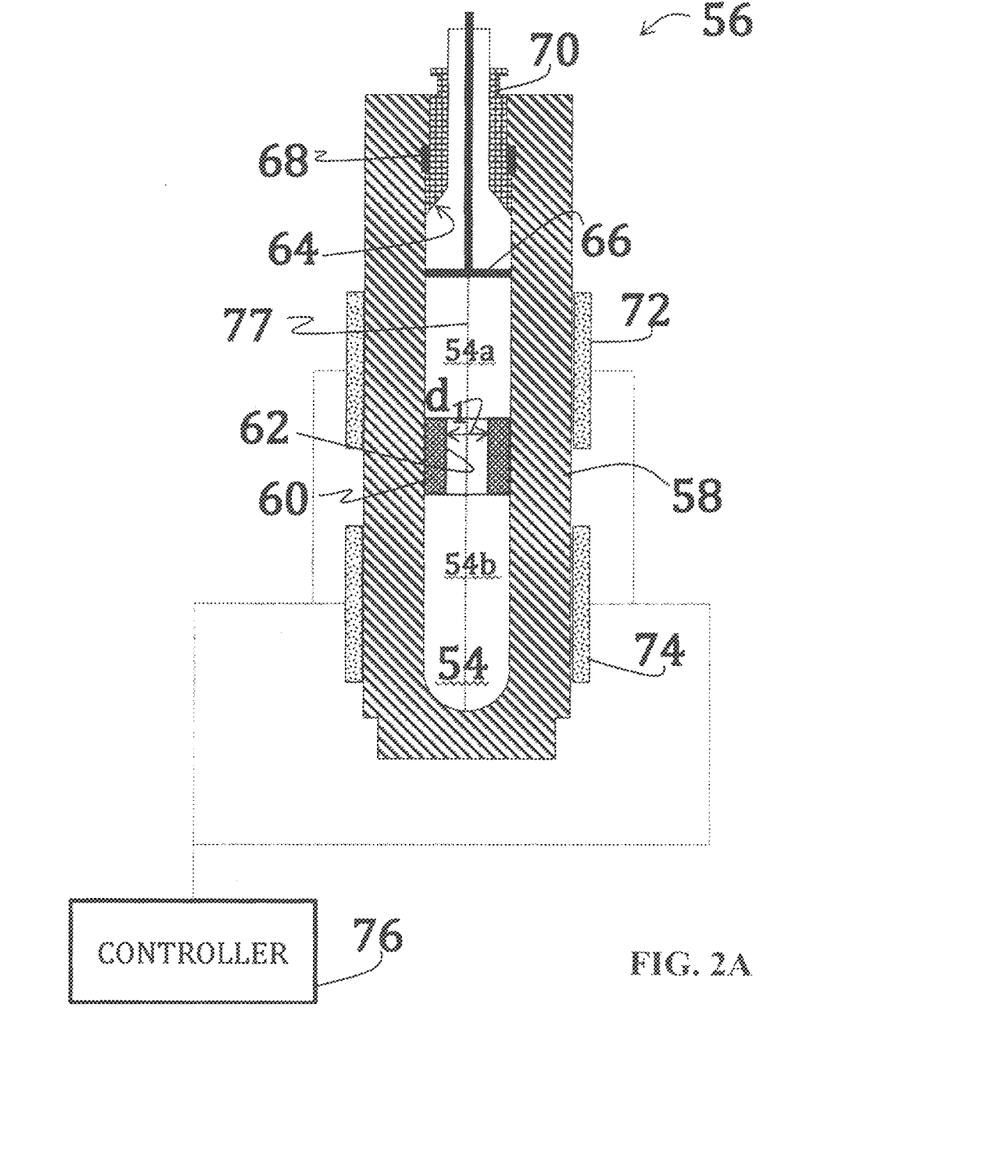
FIG. 2A is a side elevational view of an autoclave, shown in cross-section, suitable for performing the method of FIG. 1 according to embodiments of the present invention.
Figure 2B:
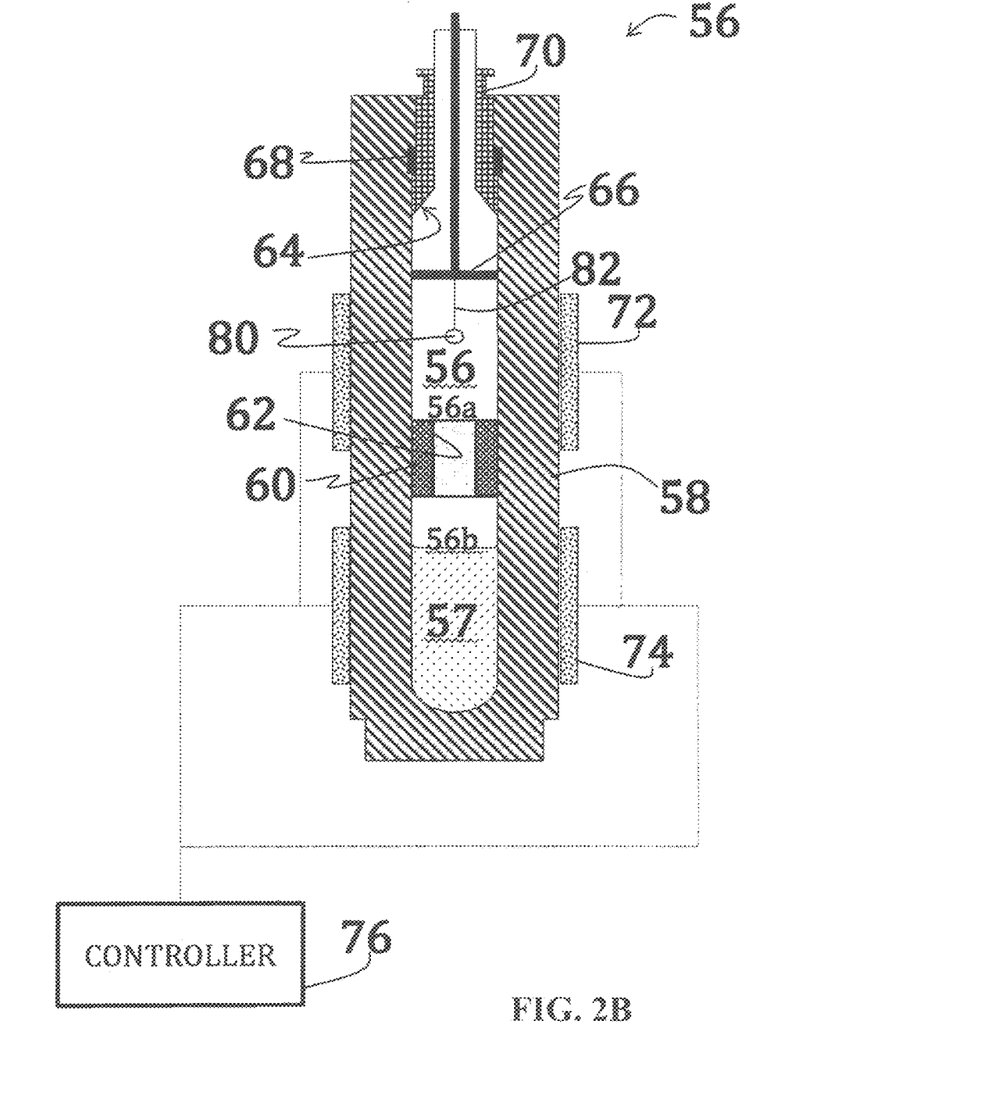
FIG. 2B is a side elevational view of an autoclave, shown in cross-section, suitable for performing the method of FIG. 1 according to embodiments of the present invention.

The exemplary pressurizable reaction device 56 illustrated in FIG. 2 is an autoclave; however, those skilled in the art having the benefit of the disclosure provided herein would readily appreciate that the illustrated structure is non-limiting. The autoclave 56 includes a wall 58 enclosing the chamber 54, which may be separated into upper and lower regions 54a, 54b by a baffle 60. The baffle 60 may be constructed from any inert material, for example, a precious metal, and includes an opening 62 therein having a diameter, d$^1$, selected to permit fluid communication there through ranging from about 15% to about 45%. In this way, the baffle 60 permits fluidic communication between the upper and lower regions 54a, 54b of the chamber 54 while maintaining these regions 54a, 54b as separate. Although the baffle 60 is illustrated as having a single opening 62, it would be readily understood that more than one opening may be used. In-fact, according to some embodiments of the present invention, the baffle 60 may be porous or comprise a mesh material, for example.

The chamber 54 is accessible through an open end 64, into which a plug 66 and seal 68 may be inserted before pressurizing the chamber 54 and secured with a locking collar.

Externally, heaters 72, 74 (two are shown) at least partially surround the wall 58 of the autoclave 56, each corresponding to a respective one of the upper and lower chambers 54a, 54b. The heaters 72, 74 are operably coupled to a controller 76, which may be configured to operably control the heaters 72, 74 such that the upper chamber 54a may be heated to a temperature that is different from a temperature of the lower chamber 54b. Said another way, the heaters 72, 74 may be operated so as to form a temperature gradient between the upper and lower chambers 54a, 54b. According to embodiments of the present invention, and as described in great detail below, with the thermal gradient ranging from about 1° C. to 130° C., preferably from about 25° C. to about 80° C., and more preferably from about 40° C. to 60° C.

The heaters 72, 74 may have any suitable structure, form, or number. Particularly, and as shown, band heaters 72, 74 are used to circumferentially surround the 58 and chamber 54 therein. Other constructions and methods may be used, so long as a temperature difference exists along a longitudinal axis 77 of the chamber 54 of the autoclave 56.

Referring again to FIG. 1, with reference to FIG. 2A, and with the feedstock and mineralizer solution (collectively illustrated as liquid 57) prepared within the chamber 54, a seed crystal 80 may then be suspended within the upper chamber 54a (Block 78). The crystal suspension 82 may include wires, clamps, and woven wire mesh constructed from an inert material, such as a precious metal.

If necessary, although not shown, de-ionized water may be added to the chamber 54 such that a total volume of solution 57 and water occupies about 40% to about 95% of the chamber's internal volume.

Continuing with FIGS. 1 and 2, the chamber 54 of the autoclave 56 may then be sealed, pressurized (for example, at a pressure of from about 200 psi to about 100,000 psi, preferably from about 10,000 psi to about 40,000 psi, more preferably from about 20,000 psi to about 25,000 psi), and heated (Block 84). In Block 86, a temperature gradient is formed along the longitudinal axis 77 of the chamber 54. In that the lower chamber 54b may be heated to a temperature range of from about 200° C. to 1000° C., preferably from about 300° C. to about 800° C., more preferably from about 600° C. to 700° C. This high temperature causes a partial amount of the uranium nutrient/feedstock to enter the mineralizer solution. Concurrently, the upper chamber 54a may be heated to a temperature range of from about 50° C. to 950° C., preferably from about 200° C. to about 700° C., more preferably from about 550° C. to about 650° C., but less than the temperature of the lower chamber 54b. At the lower temperature, the solubility of nutrient in the mineralizer solution is reduced and, resultantly, nutrient will precipitate out of solution and spontaneously grow crystals onto the seed crystal 80 (FIG. 2A). More generally, the maximum temperature may range from about 400° C. to about 750° C., with the thermal gradient ranging from about 1° C. to 130° C., preferably from about 25° C. to about 80° C., and more preferably from about 40° C. to 60° C.

Heating and crystallization continue ("No" branch of decision block 88) until a final crystal is achieved and having one or more of a desired purity, a desired quality, and a desired size. While these characteristics of the final crystal are at least partially dependent on reaction duration, generally crystal growth continues for about 7 days to about 90 days.

When the desired growth is achieved ("Yes" branch of decision block 88), the process ends, the heat and pressure are removed from the chamber 54 such that crystal may be retrieved.

According to some alternative embodiments, the thermal gradient need not be applied nor maintained. Instead, crystal growth may be found favorable using an isothermal temperature.

According to some embodiments of the present invention, the use of one or more seed crystal 80 may be required or desired. In that regard, and with reference to FIG. 3, a baffle-based seed ladder 90 is shown. The baffle-based seed ladder 90 includes a baffle portion 92 and a ladder portion 94 and, thus, may comprise a unitary construction or, alternatively, may be separately constructed and joined together. As was noted above, the construction may include any inert material, for example, precious metals.

Figure 3:
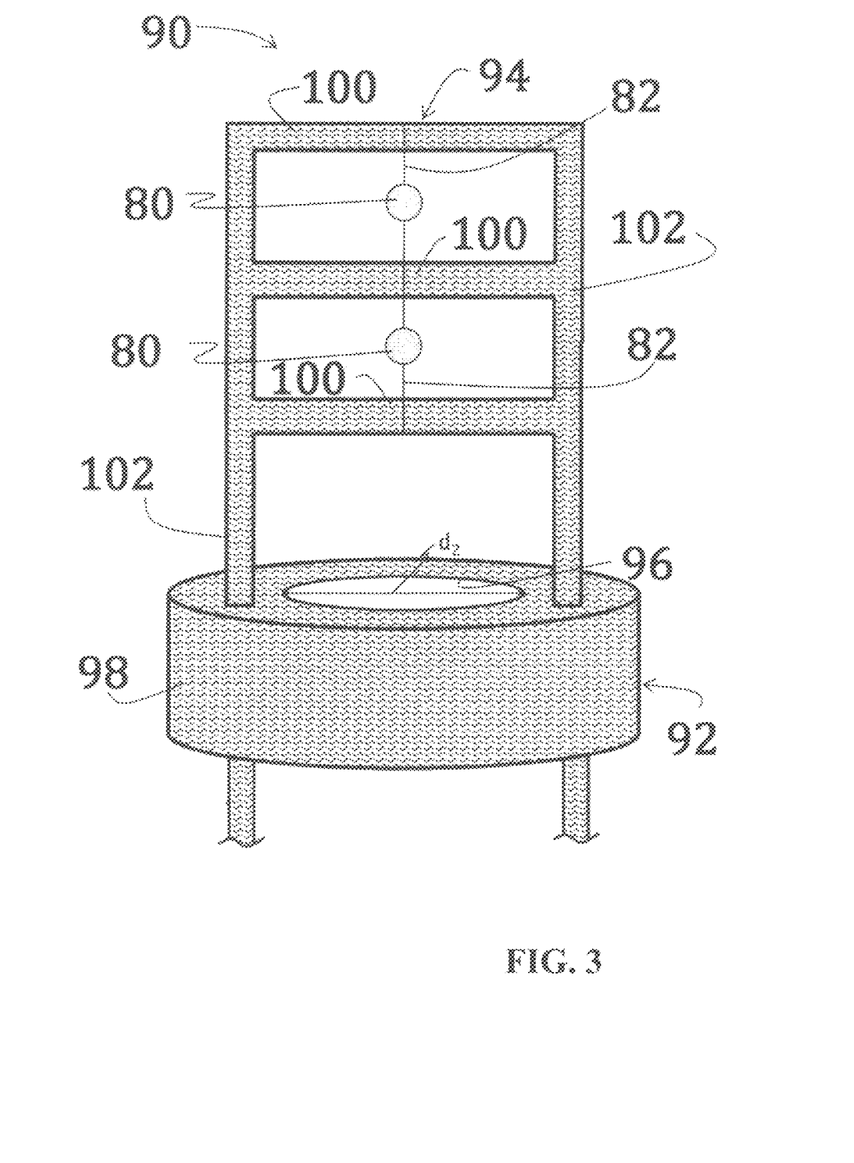
FIG. 3 is a side elevational view of a seed rack ladder suitable for use in synthesizing uranium oxide crystals in accordance with some embodiments of the present invention.

The baffle portion 94 includes an opening 96 within a main body 98 having a diameter, d$_2$, selected to permit fluid communication there through ranging from about 15% to about 45% and so as to permit fluidic communication between the upper and lower regions 54a, 54b (FIG. 2) of the chamber 54 (FIG. 2) while maintaining these regions 54a, 54b (FIG. 2) as separate.

The ladder portion 94 includes a one or more rungs 100 (three rungs 100 are shown) extending from vertical supports 102. Seed crystals 80 (two seed crystals 80 are shown) are positioned between adjacent ones of the rungs 100 by at least one suspension 82, which may be similar to the suspensions discussed in detail above.

Use of the baffle-based seed ladder 90 may provide the benefit of growing more than one crystal at a time in accordance with embodiments of the present invention as described in detail here.

Figure 4:
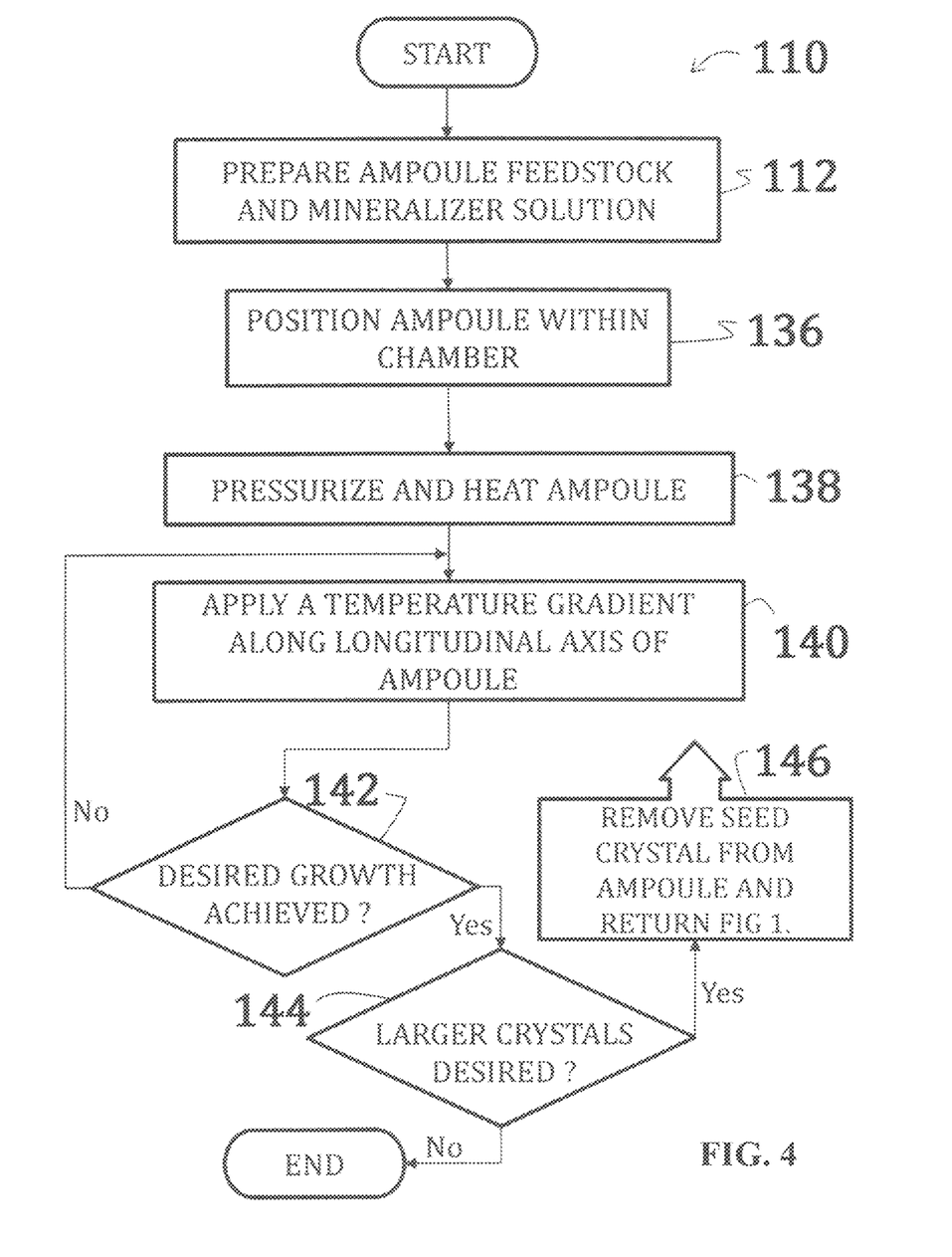
FIG. 4 is a flowchart illustrating a method of synthesizing uranium-based seed crystals in accordance with another embodiment of the present invention.
Figure 5:
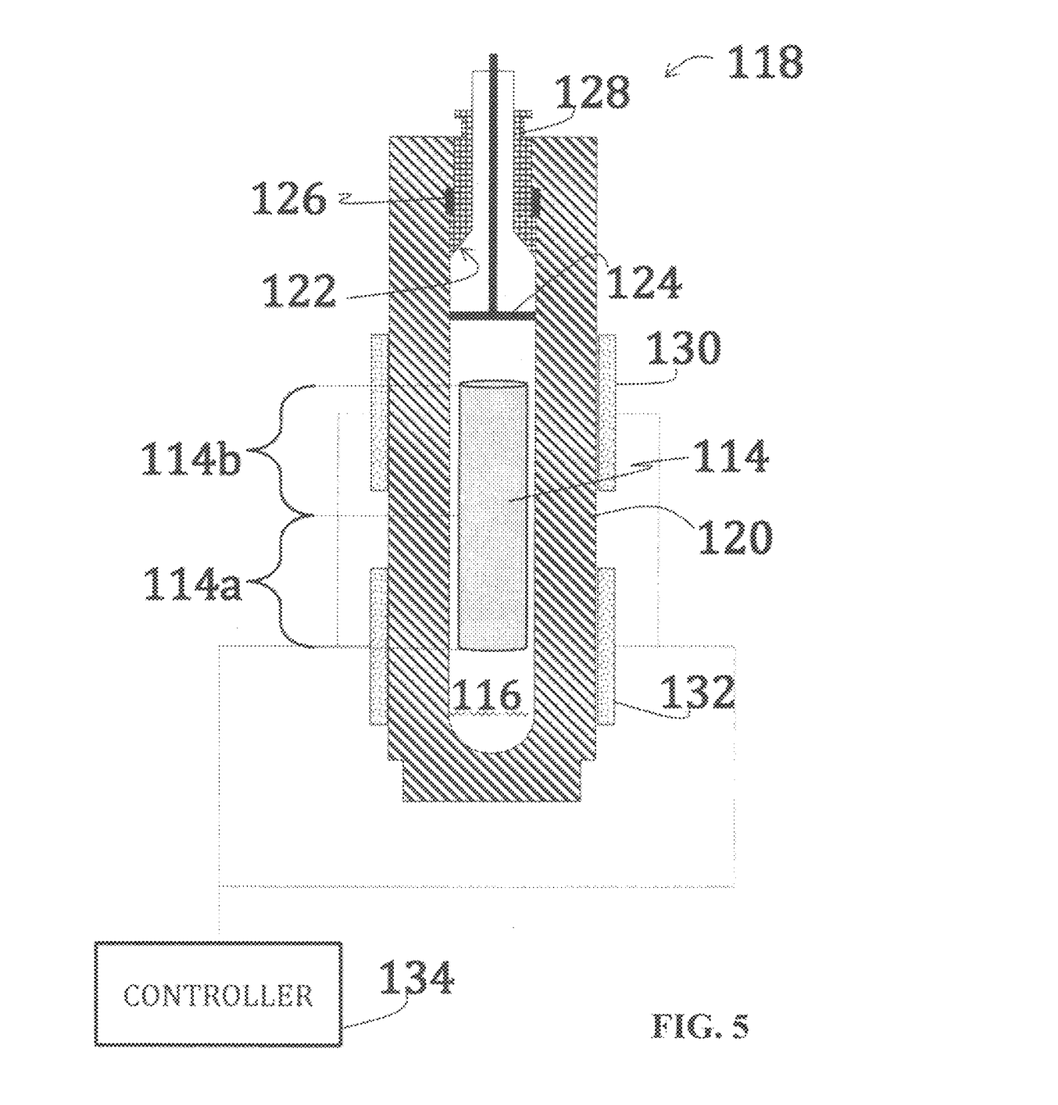
FIG. 5 is a side elevational view of an autoclave, shown in cross-section, suitable for performing the method of FIG. 4 according to embodiments of the present invention.

Turning now to FIGS. 4 and 5, a method of forming crystals according to another embodiment of the present invention is shown. In Block 112, an ampoule 114 configured to be positioned within a chamber 116 of a pressurizable reaction device 118 is prepared with a feedstock and a mineralizer solution. As described previously, the composition of the feedstock and the mineralizer solution depends, in part, of the desired crystal yielded and may be selected in accordance with the parameters set forth above. Again, mineralizer solutions may have concentrations ranging from about 0.1 M to about 30 M.

The exemplary pressurizable reaction device 118 illustrated in FIG. 5 is similar to the autoclave 56 of FIG. 2; however, those skilled in the art having the benefit of the disclosure provided herein would readily appreciate that the illustrated structure is non-limiting. Here, the device 118 includes a wall 120 enclosing the chamber 116. The chamber 116 is accessible through an open end 122, into which a plug 124 and seal 126 may be inserted before pressurizing the chamber 116 and secured with a locking collar 128.

Externally, heaters 130, 132 (two are shown), similar to those described above, at least partially surround the wall 120 of the device 118. The heaters 130, 132 may be operably controlled by a controller 134 such a temperature gradient is created along a longitudinal axis 77 (FIG. 2) of the chamber 116. According to embodiments of the present invention, and as described in great detail below, the temperature gradient variation may range from about 1° C. to 130° C., preferably from about 25° C. to about 80° C., and more preferably from about 40° C. to 60° C.

The ampoule 114 may be constructed of a precious metal (silver, gold, platinum, or palladium, for example) and, according to some embodiments of the present invention, may comprise a metal tubing, such as those commercially-available from by Refining Systems, Inc. (Las Vegas, Nev.) and having one end welded or otherwise closed to retain the feedstock and the mineralizer solution therein.

Referring again to Block 112, the feedstock and the mineralizer solution are added to the ampoule 114 until a combined total of the feedstock and mineralizer solution within the ampoule is set to occupy a majority percentage (ranging from about 40% to about 90%) of the ampoule's total volume. The ampoule 114 may then be sealed (for example, by welding any open end) and is positioned within the chamber 116 of the device 118 of FIG. 5 (Block 136). If necessary, although not shown, de-ionized water may be added to the chamber 116 such that a total volume of ampoule 114 and water occupies about 65% to about 90% of the chamber's internal volume.

Continuing with FIGS. 4 and 5, the chamber 116 of the device 118 may then be sealed, pressurized (for example, at a pressure of from about 200 psi to about 100,000 psi, preferably from about 10,000 psi to about 40,000 psi, more preferably from about 20,000 psi to about 25,000 psi), and heated (Block 138). In Block 140, a temperature gradient is formed along the longitudinal axis 77 (FIG. 2) of the chamber 116, which may generally coincide with a longitudinal axis (not shown) of the ampoule 114. In that regard, the ampoule 114 will have a lower region 114a heated to a temperature that is greater than a temperature of an upper region 114b. It should be readily appreciated that the terms "lower" and "upper" are merely used as directional reference herein with respect to FIG. 5 and should not be considered to be limiting.

According to some embodiments, the highest temperature of the ampoule 114 at the lower region 114a will be a temperature range of from about 50° C. to 950° C., preferably from about 300° C. to about 800° C., more preferably from about 600° C. to 700° C., but greater than the temperature of the lower chamber 114b. At this high temperature, uranium nutrient/feedstock enters the mineralizer solution. The upper region 114b may then heated to a temperature range of from about 50° C. to 950° C., preferably from about 200° C. to about 700° C., more preferably from about 550° C. to 650° C., but less than the temperature of the lower chamber 114a. At the lower temperature, the solubility of nutrient in the mineralizer solution is reduced and, resultantly, nutrient will precipitate out of solution and spontaneously form spontaneously crystals on an inner wall (not shown) of the ampoule 114).

Heating and crystallization continue ("No" branch of decision block 142) until a desired growth is achieved. While the final size of the crystal is dependent on reaction duration, generally crystal growth continues for about for a period of from about 24 hours to about one year, preferably from about 14 days to about 180 days, more preferably from about 90 days to about 120 days.

When the desired growth is achieved ("Yes" branch of decision block 142), a decision is made as to whether larger crystals are desired (Decision block 144). If larger crystals are desired ("Yes" branch of decision block 144), then heat and pressure are removed from the chamber 116, the ampoule 114 opened, and a small crystal may be extracted from the inner wall of the ampoule 114 (Block 146). The small, extracted crystal may then be used as a seed crystal in the method 50 (FIG. 1) described above. Otherwise ("No" branch of decision block 144), the process ends, the heat and pressure are removed from the chamber 116 and the ampoule 114 opened such that crystals may be retrieved.

Figure 6:
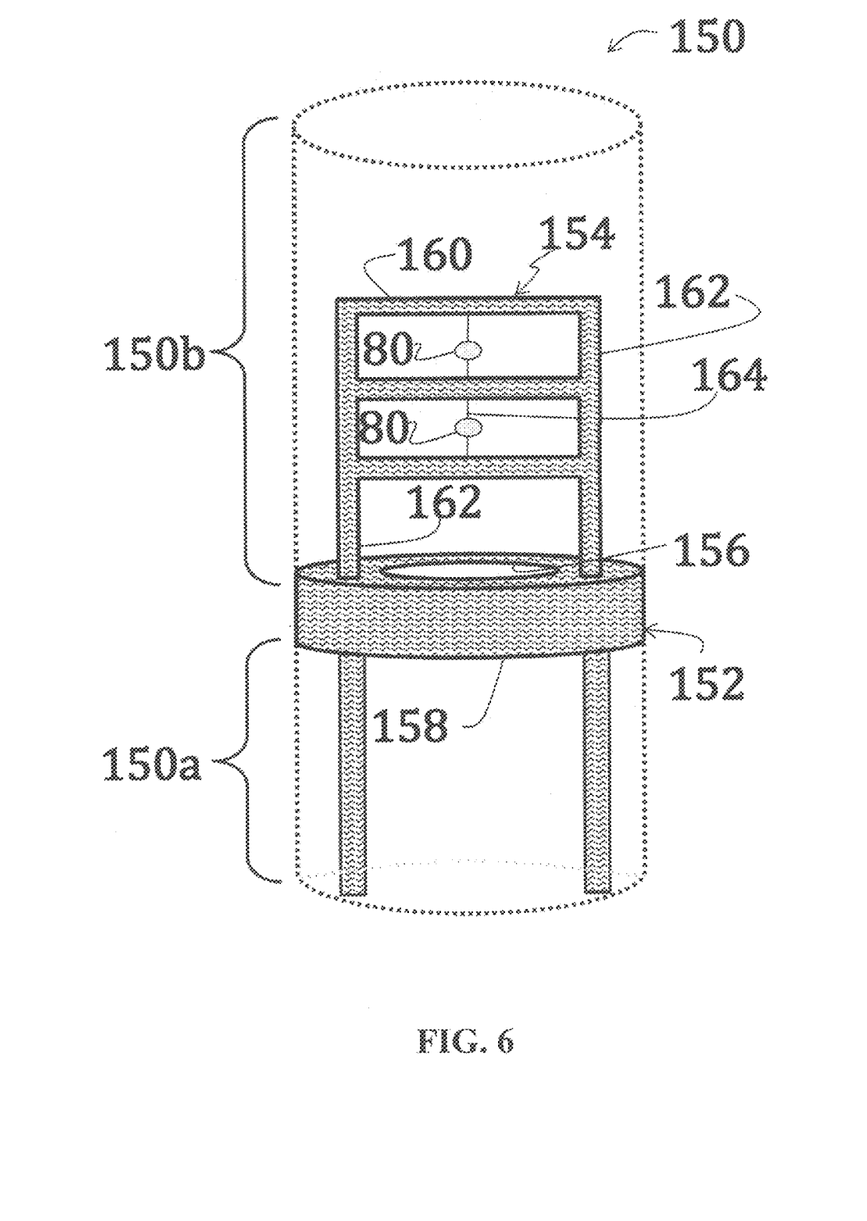
FIG. 6 is a side elevational view of an exemplary ampoule suitable for use in synthesizing uranium oxide crystals in accordance with some embodiments of the present invention.

Similar to the alternate embodiment described above, an ampoule 150, used in accordance with methods described herein, may further comprise a baffle 152, with or without a seed ladder 154, the latter of which is shown in FIG. 6 (the ampoule 150 being in phantom). The baffle 152 with ladder 154 may comprise a unitary construction of an inert material (such as a precious metal) or, alternatively, may be separately constructed and joined together. As was noted above, the construction may include any inert material, for example, precious metals.

The baffle 152 includes an opening 156 within a main body 158 having a diameter selected to permit fluid communication there through ranging from about 15% to about 45% and so as to permit fluidic communication between the upper and lower regions 150b, 150a of the ampoule 150 while maintaining these regions 150b, 150a as separate.

The seed ladder 154 includes a one or more rungs 160 (three rungs 160 are shown) extending from vertical supports 162. Seed crystals 80 (two seed crystals 80 are shown) are positioned between adjacent ones of the rungs 160 by at least one suspension 164, which may be similar to the suspensions discussed in detail above. In this way, more than one seed crystal 80 may be used for growing crystals.

Test Methods

Method of determining crystal structure. For purpose of this specification, a Rigaku XtaLab Mini is used to generate the data needed to determine crystal. The software used to collect the data and integrate it is Crystal Clear Expert 2.0 r14. The final crystal structure is solved using Shelxtl Version 6.10. The following coordinates are obtained via this method:
  cell length a;
  cell length b;

cell length c;
cell angle alpha;
cell mangle beta;
cell angle gamma and
x, y and z coordinates for Rb1, U1, and O1.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1 Single crystal $RbUO_3$ by the hydrothermal technique. Growth conditions utilize a 1.25 inch internal diameter autoclave constructed from Inconel 718. A sealed, 0.75 inch internal diameter silver tube with the reactants is loaded into the autoclave and counter pressure water is added to the autoclave to prevent the silver tubing from rupturing. The silver tube has an overall length of 8 inches. The interior of the silver tube has ~12.5 grams of powder $U_3O_8$ feedstock added to the bottom section of the tube along with an internal silver baffle with a porosity of ~15%. 35 mL of 6M RbOH is added to the tube prior to sealing (welding) it shut. The fully assembled silver reaction tube is then loaded into the autoclave along with external baffles: one at each end and one at the mid-point. Three external band heaters are affixed to the autoclave, which enable control of a thermal gradient. The bottom band heater, which corresponds with the feedstock zone is held at 650° C. The middle band heater, is held at 600° C. The upper band heater extends above the silver tube and is held at 600° C. The application of the temperature generates 20-25 kpsi of pressure. These conditions are maintained for 14 days.

Once the ampule is removed from the autoclave and opened, the remaining contents of the ampule are collected on a filter paper underneath. The main product is $RbUO_3$ single crystals larger than 11 mm$^2$, as characterized by single crystal X-ray diffraction, with some remaining undissolved feedstock as a minor product.

Example 2 Single crystal $RbUO_3$ by the hydrothermal technique using a seed crystal. The process of Example 1 is repeated accept a portion of the $RbUO_3$ produced in Example 1 is used as a seed crystal.

Example 3 Single crystal $RbUO_3$ by the hydrothermal technique using a non-native seed crystal. The process of Example 1 is repeated accept a non-native seed crystal. Suitable non-native seed crystals include $SrTiO_3$, $KUO_3$, and other perovskite structures.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A process for making a single crystalline $RbUO_3$ having a Pm-3m symmetry structure, said process comprising autoclaving for a period of from about 24 hours to about one year, at a pressure of from about 200 psi to about 100,000 psi, a container comprising an ampoule comprising one or more powdered feedstock(s) and one or more mineralizer(s), said ampoule having a bottom feedstock zone and a top crystal growth zone, said bottom feedstock zone having a temperature range of from about 200° C. to 1000° C., and top crystal growth zone having a temperature range of from about 50° C. to 950° C., said process having a temperature gradient between said bottom feedstock zone and said top crystal growth zone of from about 1° C. to 130° C.; said container having an internal fill to ampoule volume ratio of 0.001-4.999:5, a feedstock to mineralizer ratio of 0.01-8:4 and when more than one powdered feedstock is employed a feedstock ratio of from 0.01:4 to 4:0.01 for said feedstocks.

2. The process of claim 1, said process comprising autoclaving for a period of from about 14 days to about 180 days, at a pressure of from about 10,000 psi to about 40,000 psi, a container comprising an ampoule comprising one or more powdered feed stocks and one or more mineralizers, said ampoule having a bottom feedstock zone and a top crystal growth zone, said bottom feedstock zone having a temperature range of from about 300° C. to about 800° C., and top crystal growth zone having a temperature range of from about 200° C. to about 700° C., said process having a temperature gradient between said bottom feedstock zone and said top crystal growth zone of from about 25° C. to about 80° C.; said container having an internal fill to ampoule volume ratio of 2-4.5:5, a feed stock to mineralizer ratio of 0.5-3:4 and when more than one powdered feedstock is employed a feedstock ratio of from 1:4 to 4:1 for said feedstocks.

3. The process of claim 2, said process comprising autoclaving for a period of from about 90 days to about 120 days, at a pressure of from about 20,000 psi to about 25,000 psi, a container comprising an ampoule comprising powdered feedstock and a mineralizer, said ampoule having a bottom feedstock zone and a top crystal growth zone, said bottom feedstock zone having a temperature range of from about 600° C. to 700° C. and top crystal growth zone having a temperature range of from about 550° C. to 650° C., said process having a temperature gradient between said bottom feedstock zone and said top crystal growth zone of from about 40° C. to 60° C.; said container having an internal fill to ampoule volume ratio of 4:5, a feed stock to mineralizer ratio of 1:4 and when more than one powdered feedstock is employed a feedstock ratio of from 1:1 or said feedstocks.

4. The process of claim 3 having a temperature gradient between said bottom feedstock zone and said top crystal growth zone of about 50° C.

5. The process of claim 1 wherein said crystal growth zone of said container comprises a seed crystal.

6. The process of claim 5 wherein said crystal growth zone of said container comprises a seed crystal having a Pm-3m space group.

7. The process of claim 1 wherein said seed crystal has:
a) a cell length a of 4.3320(5);
b) a cell length b of 4.3320(5);
c) a cell length c of 4.3320(5);
d) a cell angle alpha of 90.00;
e) a cell angle beta of 90.00; and
f) a cell angle gamma of 90.00.

8. The process of claim 7 wherein said seed crystal has:
a) a Rb1 having x=0.5000, y=0.5000 and z=−0.5000;
b) a U1 having x=0.0000, y=0.0000 and z=−0.0000; and
c) a O1 having x=0.5000, y=0.0000 and z=0.0000.

9. The process of claim 1 wherein said crystal growth zone of said container comprises a non-native seed crystal.

10. The process of claim 9 wherein said crystal growth zone of said container comprises a non-native seed crystal, said non-native seed crystal having a perovskite structure.

11. The process of claim 10 wherein said crystal growth zone of said container comprises a non-native seed crystal, said non-native seed crystal comprising $SrTiO_3$ and $KUO_3$.

\* \* \* \* \*